United States Patent [19]

McCaldin et al.

[11] Patent Number: 5,371,409
[45] Date of Patent: Dec. 6, 1994

[54] WIDE BANDGAP SEMICONDUCTOR LIGHT EMITTERS

[75] Inventors: James O. McCaldin, San Diego; Thomas C. McGill; Mark C. Phillips, both of Pasadena, all of Calif.

[73] Assignee: California Institute of Technology, Pasadena, Calif.

[21] Appl. No.: 153,783

[22] Filed: Nov. 16, 1993

Related U.S. Application Data

[63] Continuation of Ser. No. 885,469, May 19, 1992, abandoned.

[51] Int. Cl.$^5$ .................. H01L 23/00; H01L 29/78
[52] U.S. Cl. .................. 257/741; 257/191; 257/201
[58] Field of Search .......... 257/741, 191, 99, 201, 257/78

[56] References Cited

U.S. PATENT DOCUMENTS

| | | | |
|---|---|---|---|
| 3,018,426 | 1/1962 | Ruppel | 357/17 |
| 3,309,553 | 3/1967 | Kroemer | 357/17 |
| 3,366,819 | 1/1968 | Crowder et al. | 357/17 |
| 3,655,429 | 4/1972 | Deklerk | 437/5 |
| 3,927,385 | 12/1975 | Pratt, Jr. | 257/78 |
| 3,959,026 | 5/1976 | Marine et al. | 148/1.5 |
| 4,003,741 | 1/1977 | Gallet et al. | 75/135 |
| 4,335,461 | 6/1982 | Streifer et al. | 372/45 |
| 4,433,417 | 2/1984 | Burnham et al. | 372/45 |
| 4,477,824 | 10/1984 | Dutt | 357/17 |
| 4,546,480 | 10/1985 | Burnham et al. | 372/45 |
| 4,671,829 | 6/1987 | Kawabata et al. | 148/171 |
| 4,719,155 | 1/1988 | Matsumoto | 428/700 |
| 4,819,058 | 4/1989 | Nishizawa | 357/17 |
| 4,955,031 | 9/1990 | Jain | 372/45 |
| 4,992,837 | 2/1991 | Sakai et al. | 357/17 |
| 5,008,891 | 4/1991 | Morita | 372/45 |
| 5,010,376 | 4/1991 | Nishimura et al. | 357/17 |
| 5,027,168 | 6/1991 | Edmond | 357/17 |
| 5,037,709 | 8/1991 | Tomomura et al. | 428/690 |
| 5,045,894 | 9/1991 | Migita et al. | 372/45 |
| 5,045,897 | 9/1991 | Ahlgren | 357/17 |
| 5,055,363 | 10/1991 | Tomomura et al. | 428/690 |
| 5,081,632 | 1/1992 | Migita et al. | 357/17 |
| 5,091,758 | 2/1992 | Morita | 357/17 |
| 5,097,298 | 3/1992 | Ehara | 357/17 |

OTHER PUBLICATIONS

Ren et al, 'Properties of ZnSe-ZnSeTe . . . ' *Journal of Crystal Growth*, 1992.

Primary Examiner—Andrew J. James
Assistant Examiner—Stephen D. Meier
Attorney, Agent, or Firm—Blakely, Sokoloff, Taylor & Zafman

[57] ABSTRACT

Type-II semiconductor heterojunction light emitting devices formed on a substrate are described wherein a graded injection layer is used to accelerate electrons over the electron barrier formed by the junction. Further, wide band gap semiconductor LEDs and lasers are proposed formed of II-VI materials which emit light in the blue and green wavelengths. Particularly, a system composed of n-CdSe:Al/Mg$_x$Cd$_{1-x}$Se/Mg$_y$Zn$_{1-y}$Te/p-ZnTe are described where the value of y determines the wavelength of the emitted light in the green or blue region and x varies across the graded injection layer for raising the energy levels of excited electrons.

28 Claims, 4 Drawing Sheets

WIDE BANDGAP SEMICONDUCTOR LIGHT EMITTERS

STATEMENT OF GOVERNMENT INTEREST

The present invention was made with the support of the United States Navy Grant No. N00014-90-J1742. The United States Government may have rights to the invention.

This is a continuation of application Ser. No. 07/885,469 filed May 19, 1992.

FIELD OF THE INVENTION

The present invention relates to semiconductor light emitters such as diodes and lasers, and to methods of manufacturing the same.

BACKGROUND

Semiconductor light emitters are well-known and fall broadly into two categories: light emitting diodes (LEDs) and semiconductor lasers. The applications of these devices are numerous. LEDs are used extensively as displays, warning lights and indicating lights. Semiconductor lasers find wide application in the communications fields, such as for transmitting signals down optical fibers, writing information on compact discs and for use in projection televisions. While LEDs and semiconductor lasers are both light emitters, in many applications the two different devices are not interchangeable. Light emitting diodes are the devices of choice for many display applications. The low operating current, low power consumption, dispersal of light, and typical low cost of manufacturing are all advantages that light emitting diodes have over lasers for displays. They exhibit very long lives and maintain high efficiency and thus, have begun to replace many incandescent lamps in a number of applications. Semiconductor lasers, on the other hand, find wide application where coherent beams of light are required as described above.

While versatile and wide in their application, LEDs and semiconductor lasers suffer one serious deficiency; the wide variety of selection among them is severely limited in the green or blue wavelengths. While yellow and red semiconductor light emitters are popular and well-developed, blue and green light emitters have remained elusive. Blue and green light emitters would lend themselves to numerous applications. They would provide for advanced displays in the blue and green, where the human eye is most sensitive. They would provide the third primary color, the other two being red and yellow, whereby any color can be generated by combining those primaries in particular combinations. Also, because seawater shows the lowest absorption in the blue and green wavelengths, a blue or green semiconductor laser would provide an underwater optical communication means not currently available. In the recording industry, the density of information that may be recorded on an optical disc is currently limited by the wavelengths of the laser. These densities could be greatly increased, by a full order of magnitude, with the development of an inexpensive compact blue light emitter.

The mechanisms by which semiconductors emit light have been well-studied and are fairly well understood. LEDs and semiconductor lasers emit light as a result of electronic excitation of a material. An electron in an excited energy state, upon relaxing to a lower energy state, can emit a photon corresponding to the energy difference between the excited state and the lower energy state. The methods of exciting electrons vary, but for semiconductor light emitters the primary method is by injection electroluminescence. Energy is added to the system to coax electrons to a higher energy state. The energy states of concern in semiconductor light emitters can be characterized as the conduction band and the valence band.

Semiconductors are of three types, p-type, n-type and intrinsic. Intrinsic semiconductors can be made either p-type or n-type by introducing impurities, also called dopants of p-type or n-type, respectively. Semiconductor light emitting devices are essentially characterized by p-type material and n-type material having a pn-junction therebetween. Light emitting semiconductor devices have a recombination region between or within the p-type and n-type regions. At equilibrium, no light will be emitted by the device. However, if electrons from the n-type material can be coaxed into the conduction band over the holes of the p-type material, a situation arises where a number of electrons are excited. This coaxing is carried out by applying a forward bias across the junction. Electrons, once excited, after a period of time will relax from their excited energy level either spontaneously or by stimulation. This relaxation from the conduction band to the valence band often results in the emission of a photon.

The wavelength of an emitted photon will depend primarily on the energy difference between the conduction band and the valence band. This energy difference is referred to as the band gap of the material. The energy difference of the band gap is inversely related to the wavelength of emitted light by the well-known formula $E_g = hc/\lambda$ where h is Planck's constant and c is the speed of light. Blue and green light is light of shorter wavelengths than red or yellow light. Therefore, to emit blue or green light requires a greater energy difference between the conduction band and valence band of the materials used. Red and yellow light emission results from a band gap in the range of 1.77 to 2.16 eV. Green and blue emission requires a band gap in the range of about 2.2 to 2.9 eV and beyond that to go into the violet. Sometimes the emitted light is slightly less energetic than the value $E_g$, because carriers transition between shallow energy levels near the band edges.

Thus, to use direct emission of light as an approach to blue/green semiconductor light emitting devices, one has to obtain a band gap that exhibits the appropriate energy difference. Further, one has to be able to construct electronic devices with both n-type and p-type doping and to make appropriate electrical contact for easy conversion of current to emitted photons. A quick survey of the periodic table in the semiconductor region indicates that three primary groups of semiconductors are potentially useful for this application: the so-called III-V semiconductors in which the compound is made of an element from column III and an element from column V, the II-VI compounds in which the compound is made up of an element from column II and an element from column VI, and the compounds from the elements of column IVa of the periodic table.

For the III-V semiconductors, those with relevant band gaps for the blue and green involve either GaP in the green or GaN in the ultraviolet. GaP, while it can be doped both p-type and n-type, suffers the problem that it has an indirect band gap. An indirect band gap makes it difficult to produce high efficiency light emitting devices because the assistance of a phonon is necessary carry out the required electron transitions. To avoid this difficulty, manufacturers utilizing such materials have had to resort to quaternary alloys of AlGaInP to obtain direct transitions and this fix is only good to 2.30 eV in the green. Furthermore, compositions in quaternary systems are very difficult to control. On the other hand, compounds of GaN are extremely difficult to dope p-type and hence, there has been great difficulty in making pn-junction light emitting devices from them.

Examination of the properties of the II—VI compounds indicates that the materials with the appropriate band gaps for emission in the green and blue are ZnTe, ZnSe, ZnS and CdS, though CdS incurs the problems of ZnS without offering a large band gap like ZnS. All of these compounds are direct band gap materials and hence, suitable for making light emitters. Again, it has been difficult to obtain doping of the required levels in these systems for making light emitting pn-junctions. Notably, ZnTe can be doped p-type but it is extremely difficult to dope n-type. ZnSe has been historically easily doped n-type but difficult to dope p-type, and the sulfides have been relatively easily doped n-type but difficult to dope p-type.

Semiconductors produced by elements from group IV are limited. The only material of practical interest is SiC. Some crystal forms of this substance have band gaps that put them in the blue and can be doped to p- and n-type. However, difficulties controlling crystal quality have resulted in only low efficiency light emitters.

Recent attempts at producing blue and green light emitters have focused heavily on two areas. One is the bulk doping of p-ZnSe. Although blue light emission lasers have been reported, the problems inherent in bulk doping are significant. Another approach has been the utilization of heterojunctions, particularly ZnTe/ZnSe. This heterojunction configuration suffers from a large lattice mismatch of 7%, and neither material can be doped both types.

Accordingly, there is room for much advancement in the quest for blue and green semiconductor light emitting devices that solve the problems of the existing state of technology.

SUMMARY OF THE INVENTION

It is an object of the present invention to provide semiconductor LEDs capable of emitting light in the blue and green wavelengths.

It is also an object of the present invention to provide semiconductor lasers capable of emitting laser light in the blue and green wavelengths.

It is also an object of the present invention to provide a method of manufacturing semiconductor light emitters for light emission in the blue and green wavelength range.

It is a further object of the present invention to provide a graded injection approach to semiconductor heterojunction lasers or LEDs.

These and other objects of the present invention are realized in the production of semiconductor light emitters in which a graded injection region is introduced for raising the energy level of electrons in a heterojunction structure capable of emitting light in the green and blue wavelengths. A type-II heterojunction composed of a p-ZnTe layer, and n-CdSe:Al layer that sandwich a $Mg_yZn_{1-y}Te$ recombination layer are employed. Disposed between the n-CdSe:Al layer and the recombination layer is a graded injector composed of $Mg_xCd_{1-x}Se$:Al. The CdSe layer is nearly lattice matched to the ZnTe layer and can easily be doped very heavily n-type. Band gap control is provided in thin layers of MgCdSe and MgZnTe alloys which are embedded in the CdSe and ZnTe layers, respectively.

BRIEF DESCRIPTION OF THE DRAWINGS

The objects, features and advantages of the present invention will be apparent from the following detailed description in which.

DETAILED DESCRIPTION

As discussed above, the bulk doping approach has serious limitations because, while some materials are easily p-doped, they are not easily n-doped. The contrary is true for other materials. The efforts to provide blue light emitting diodes has included attempts to produce p-type ZnSe. While some success has been obtained, only moderate doping levels have been achieved, in the high $10^{17}$ cm$^{-3}$ range, by using a plasma source of nitrogen as a dopant in MBE growth. These doping attempts have failed to obtain high doping levels, above $10^{19}$ cm$^{-3}$, which are needed in the contact region of light emitting devices to provide tunneling contact.

The solution in accordance with a preferred embodiment of the present invention is to avoid the above doping problems altogether. A heterojunction structure is used, a heterojunction being a junction formed between two dissimilar semiconductors. The materials are chosen such that one is easy to p-dope while the other is easy to n-dope. Further, the materials must be chosen such that a desired band gap between valence and conduction levels is present so as to yield emitted light of the desired wavelength. Finally, the materials must be chosen to be as nearly lattice matched as possible.

Figure 1:
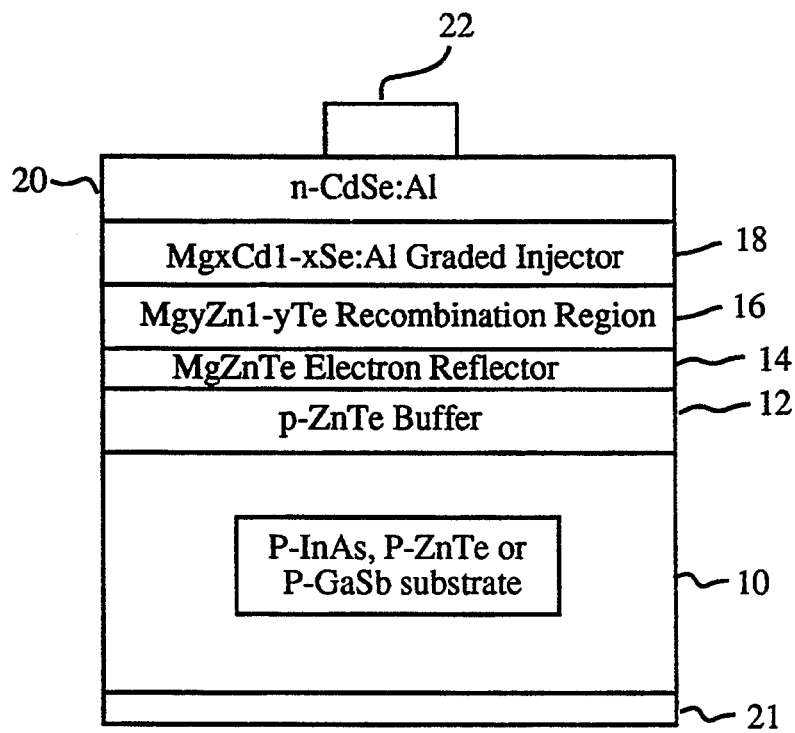
FIG. 1 shows a type-II heterojunction semiconductor LED with a graded injector suitable for light emission in the blue/green wavelengths in accordance with a preferred embodiment of the present invention.

Referring now to FIG. 1, a semiconductor light emitting device in accordance with a preferred embodiment of the present invention is shown. It turns out that in making the materials selection described above, only tellurides, among the wider gap II-VIs, can provide conventional p-type material. Hence, tellurium-based II-VIs are used as the p-type component in the preferred embodiment of the present invention. In particular, in the preferred embodiment LED of the present invention, ZnTe that is p-doped with Sb and/or growth in a Te-rich environment is used. Electrons will be provided by n-CdSe. Cadmium selenide is nearly lattice matched to ZnTe and can easily be doped very heavily n-type, well into the $10^{19}$ cm$^{-3}$ range. Therefore, in the preferred embodiment light emitting device shown in FIG. 1, a p-type substrate 10 used. These substrates are readily available commercially. The substrate needs to provide good electrical contact with a back electrode 21. The substrate layer 10 in the preferred embodiment may be either p-InAs, p-ZnTe or p-GaSb. Disposed on the substrate layer 10 is a p-type buffer region 12 composed of p-ZnTe. The purpose of the buffer region is to allow crystal imperfections arising from the substrate introduced into the growth chamber to "grow out", as is well known in the art.

In the embodiment shown in FIG. 1, there is grown upon the buffer layer 12 an electron confinement or electron reflector region 14 composed of the ternary alloy MgZnTe. The magnesium introduced has the effect of widening the band gap of that region. This region of expanded band gap creates a barrier over which electrons will not be able to cross as is well known in the laser art, e.g. in the AlAs/GaAs laser. This will have the effect of confining electrons, once injected, to the conduction band of the recombination region 16 which is disposed over the electrical reflector region 14.

The recombination region 16 is the layer where the electrons and holes will recombine resulting in the emission of photons. In the preferred embodiment, it is a p-type region in which magnesium is introduced to the p-ZnTe material to form the ternary alloy $Mg_yZn_{1-y}Ze$. The magnesium-based compounds have large band gaps, with MgTe at 3.47 eV. By varying the concentration of the magnesium when forming the MgZnTe alloy, the size of the band gap is controlled and therefore, the wavelength of the emitted light is determined. The relationship of magnesium concentration to wavelength of emitted light for the recombination region 16 is such that the more magnesium that is introduced, the wider the band gap is and, hence, the shorter the emission wavelength.

The range of emitted light possible by varying the magnesium concentration is throughout the green and blue wavelengths. The MgZnTe alloy has been shown to remain p-type over significant range of magnesium concentrations. While magnesium is used for band gap control in the preferred embodiment, other metals may provide desired control, such as manganese, beryllium and calcium.

As discussed above, a heterojunction approach for green/blue light emitters is chosen and CdSe is selected as the n-type electron source because of its appropriate band gap, near lattice match with ZnTe and ease with which it can be n-doped. In the preferred embodiment, n-doping is predominantly done with aluminum, but other electron-rich sources may be used. In FIG. 1, the n-type layer forming the heterojunction with the p-type layer is the n-layer n-CdSe:Al layer 20 and with an embedded injector region 18.

The graded injector 18 is a thin layer, approximately 100–200 Angstroms, embedded between the n-CdSe:Al layer 20 and the $Mg_yZn_{1-y}Te$ recombination layer 16. As with the recombination layer, magnesium is introduced to provide band gap control, with MgSe alone having a band gap of 3.9 eV. Unlike the recombination region 16, the graded injector region does not have a fixed concentration of magnesium. The concentration increases from the n-CdSe:Al layer 20 across the layer to the recombination region 16. The magnesium concentration can range from at least 0–50% across the layer 18. The effect of the grading will be explained more fully with reference to a later energy figure, but essentially it accelerates the electrons in the conduction band to a higher energy level, a way of "pumping" the electrons to the energy level of the conduction band of the recombination region. In fact, with 60% of the cations being Mg, conduction electrons could simply "fall" into the ZnTe conduction band. As discussed, CdSe is easily n-doped and it is believed that MgCdSe should be highly n-dopable over a wide range. Because the graded injector layer is thin relative to the n-CdSe region, it is not essential that the injector layer be highly n-dopable. The high n-type concentration in the wider n-CdSe layer will provide sufficient electrons for injection into the recombination region.

It should be noted that forming the alloys with Mg increases the lattice mismatch. However, in the CdSe/ZnTe system, using an alloy with 60% of the cations being Mg introduces only a 2.2% lattice mismatch which need not be a problem when only very thin layers are being used, e.g., 100 A. Such thin layers are possible today through the use of advanced MBE and MOVPE techniques.

Finally, the preferred embodiment structure LED has contact electrodes 21 and 22 on opposing surfaces. While other II-VI or other wide band gap materials may be used in accordance with the present invention, the above have proven advantageous, particularly, high quality ohmic contacts have been shown for both p-type ZnTe and n-type CdSe.

Figure 2:
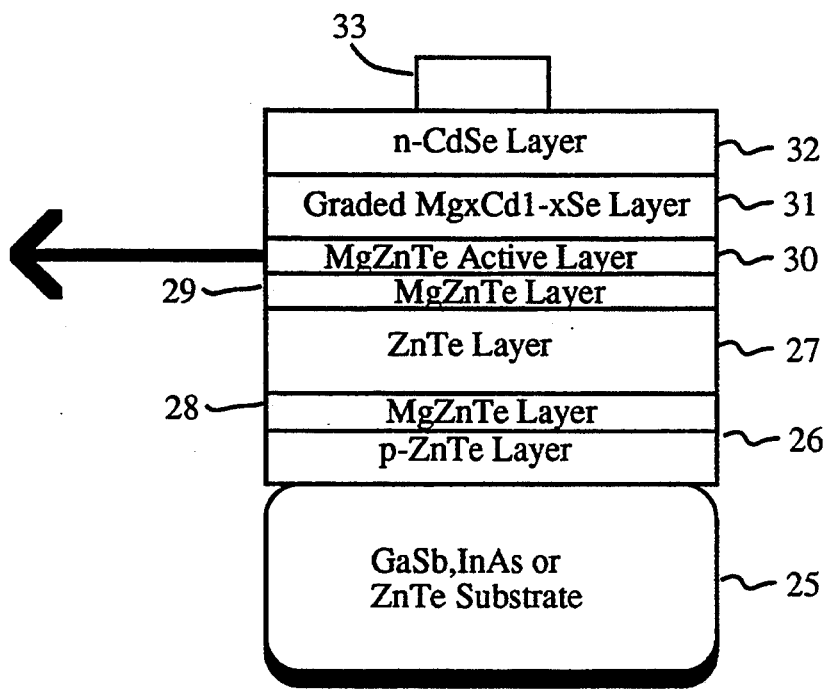
FIG. 2 shows a type-II heterojunction semiconductor laser with a graded injector suitable for light emission in the blue/green wavelengths in accordance with a preferred embodiment of the present invention.

Now referring to FIG. 2, a semiconductor laser in accordance with a preferred embodiment of the present invention is shown. Again, a heterostructure junction of II-VI materials is shown comprising n-CdSe:Al and p-ZnTe. As with the LED of FIG. 1, the laser structure is disposed over a p-type substrate 25, composed of p-InAs, p-ZnTe or p-GaSb in the preferred embodiment. Two p-ZnTe layers 26 and 27 are disposed interleaved with a MgZnTe electron confinement region 29 and a MgZnTe mode confinement region 28. The next layer disposed is the $Mg_yZn_{1-y}Te$ active region 30 from which the wavelength of emitted laser light will depend on the magnesium concentration. Finally, the n-type region disposed thereon is the n-CdSe:Al region 32 with a thin layer of $Mg_xCd_{1-x}Se:Al$ forming the graded injector 31 therein.

The graded injector regions introduced in the preferred embodiment LED and semiconductor laser overcome problems associated with type-II heterojunctions. In a type-I structure, the valence band and conduction band of the material on one side of the junction are higher and lower, respectively, than the valence band and conduction band of the material on the other side of the junction. In type-I heterojunctions, holes and the electrons easily fall into the quantum well and recombine for light emission. Such is the case with the double-heterojunction system of n-AlGaAs/GaAs/p-AlGaAs. In a type-II heterojunction, the valence band and conduction band on one side of the junction are both higher or lower than the respective bands on the other side. This creates a barrier which must be overcome by the charge carriers. In principle, type-II heterojunctions can have no barrier, but presently known cases of this occur only in narrow band gap heterojunctions. As will be pointed out below with reference to energy figures, the graded injector provides a way for electrons to traverse the barrier inherent in type-II heterojunctions. This is particularly important where wide band gaps are concerned.

Figure 3A:
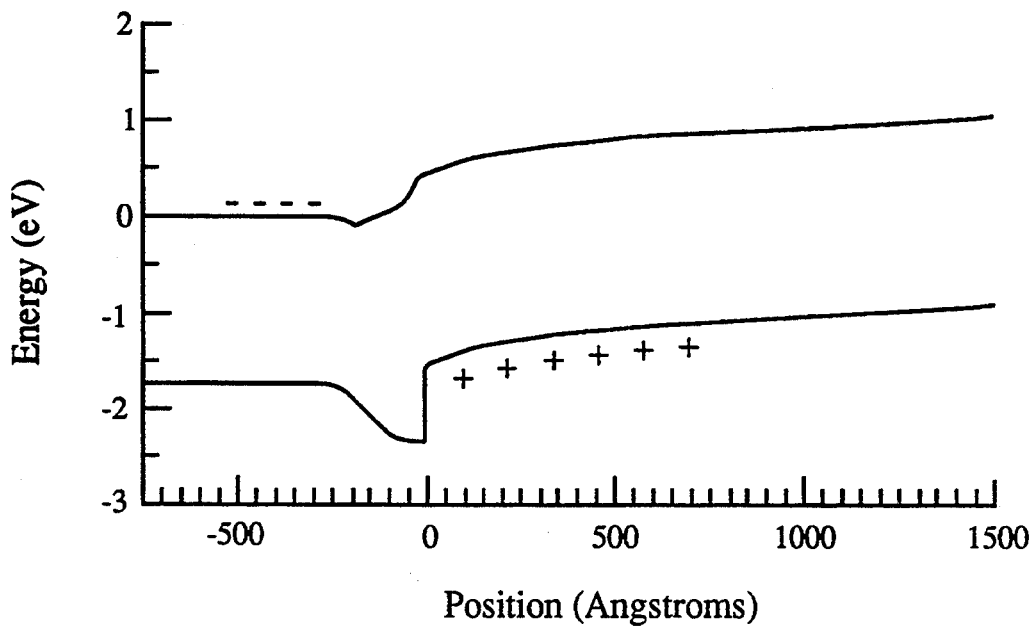
FIGS. 3(a) and 3(b) show the energy band diagrams of the preferred embodiment device under a lower forward bias and under a sufficient forward bias to result in substantial light emission.
Figure 3B:
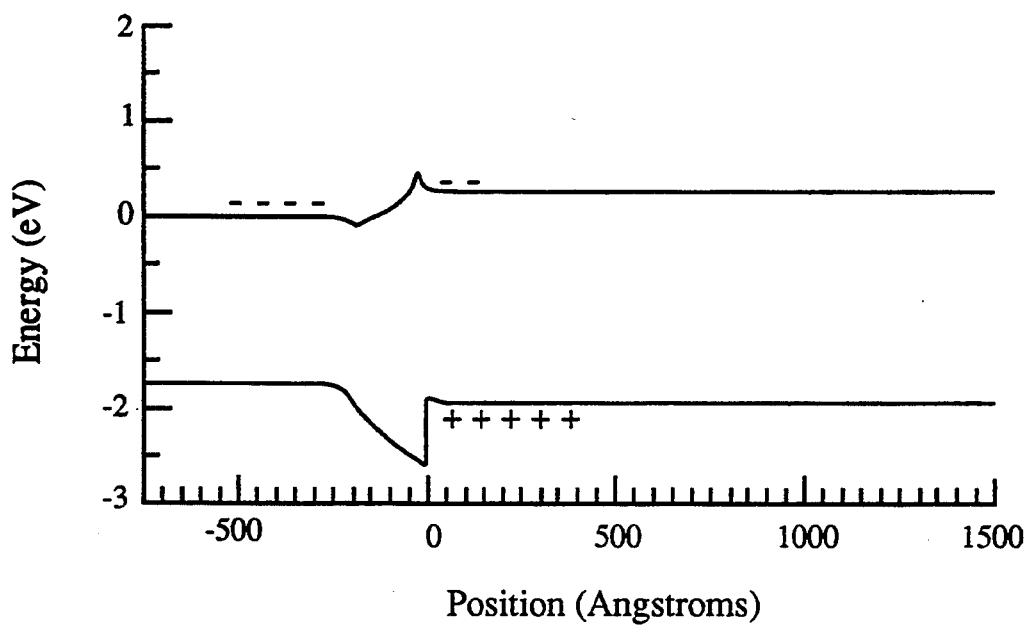
Figure 4A:
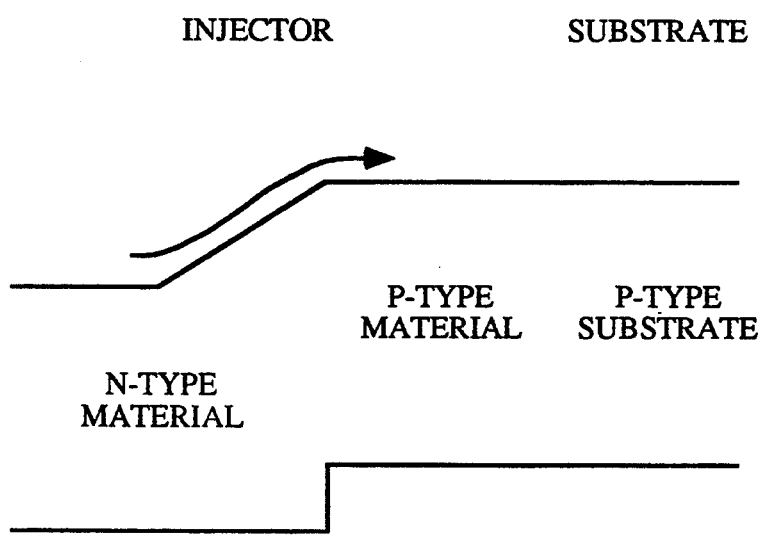
FIGS. 4(a) to 4(d) illustrate alternative embodiment configurations utilizing the graded injector of the present invention.
Figure 4B:
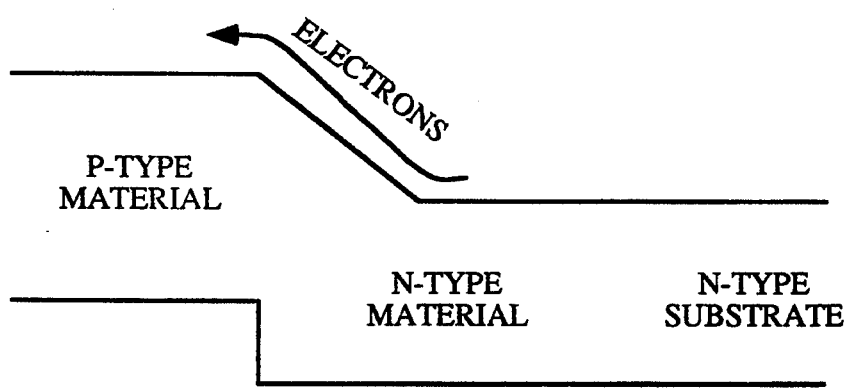
Figure 4C:
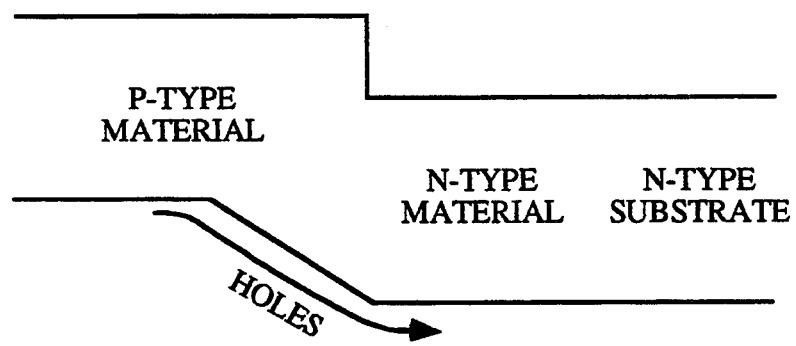
Figure 4D:
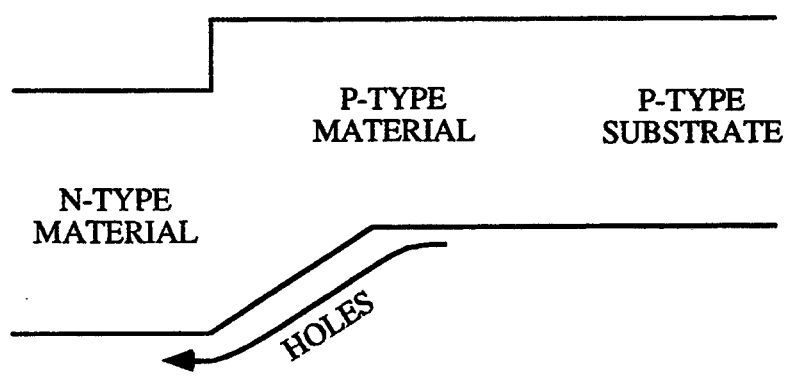

Referring next to FIGS. 3(a) and 3(b), a band diagram for a CdSe/MgZnTe/ZnTe device with a $Mg_xCd_{1-x}Se$ graded injector is shown. FIG. 3(a) is a flat band diagram showing the band gap of the various layers in the structure. The left side shows the band gap of the n-CdSe region and the right shows that of the p-ZnTe region. The band gap of the p-ZnTe region, and hence the wavelength of emitted light, is modified by the amount of magnesium introduced to the layer. The flat band state corresponds to a forward bias of approximately 1 volt. As can be seen, the electron population in FIG. 3(a) does not occupy states over the hole population due to a barrier which the electrons cannot overcome and the barrier confronting the holes at the junction of the materials.

FIG. 3 (b), on the other hand, shows the system with a larger forward bias applied, about 2 volts. Here, due to the graded injector region, the electrons are raised to a higher energy and are able to traverse the barrier and occupy states in the conduction band over holes in the valence band. The grading does not affect the valence band, only the conduction band. Therefore, the barrier for the holes does not change. Thus, under forward bias of less than 3 volts, electrons can be driven to recombine with holes in the recombination region to emit light at a wavelength corresponding to the band gap of the recombination region.

Though the preferred embodiments have been described utilizing certain binary compounds, others may prove suitable, particularly other chalcogenide compounds (those formed with a column VI element). Some ternary compounds may prove appropriate; $Be_xZn_{1-x}Te$ should have adequate blue/green band gap and be growable on substrates from ZnTe to GAAS. Further, a ZnCdSe/BeZnTe heterojunction on a p-InP substrate may prove a useful combination with Mg being added to widen the band gap.

The graded injector of the present invention is used in the preferred embodiment devices to inject electrons into a p-type material where the devices have been developed over a p-type substrate. The graded injector of the present invention may also be used to inject holes into an n-type material. Further, devices using a graded injector may be fabricated over either p-type or n-type substrates. FIGS. 4(a)–4(d) illustrate alternative configurations utilizing the graded injector of the present invention with FIG. 4(a) encompassing the preferred embodiment devices.

Although the present invention has been described in terms of preferred embodiments, it will be appreciated that various modifications and alterations might be made by those skilled in the art without departing from the spirit and scope of the invention. The invention should, therefore, be measured in terms of the claims which follow.

We claim:

1. A semiconductor light emitter formed on a substrate of a first electrical type, said light emitter being formed by a heterojunction comprising:
   a first semiconductor material of said first electrical type disposed on said substrate;
   a second semiconductor material of a second electrical type disposed over said first semiconductor material and forming a type-II heterojunction therewith, said type-II heterojunction having a barrier;
   a recombination region comprising a band gap control material disposed in a uniform concentration between said first and second semiconductor materials, said recombination region having a predetermined depth, wherein the concentration of band gap control material determines the band gap of said recombination region; and
   a graded injection region comprising a second band gap control material disposed between said recombination region and said second semiconductor material, said graded injection region having a varying concentration, wherein said varying concentration varies from a maximum where said graded injection region is adjacent to said recombination region and to a minimum where said graded injection region is adjacent to said second semiconductor material, said graded injection region having a conduction band energy level at least as high as the conduction band energy level of said recombination region where the graded injection region and recombination region are adjacent;
   wherein electrons from said second semiconductor material are raised to the conduction band energy level of said recombination region when a sufficiently large forward bias is applied, said graded injection region raising the electrons from the energy level of the conduction band of said second semiconductor material to the level of the conduction band of said recombination region to overcome said barrier.

2. The semiconductor light emitter of claim 1 wherein said substrate and first semiconductor material are p-type and said second semiconductor material is n-type.

3. The semiconductor light emitter of claim 2 wherein said first and second semiconductor materials are binary compounds composed of elements from column II and column VI of the periodic table.

4. The semiconductor light emitter of claim 2 wherein at least one of said semiconductor materials comprises a chalcogenide compound.

5. The semiconductor light emitter of claim 1 wherein said first and second band gap control materials are metals.

6. The semiconductor light emitter of claim 3 wherein said substrate comprises p-ZnTe, said first semiconductor material comprises p-ZnTe, said second semiconductor material comprises n-CdSe and said first and second band gap control materials comprise magnesium cations.

7. The semiconductor light emitter of claim 6 wherein said uniform concentration of magnesium cations of said first band gap control material in said recombination region is in the range of 0% to 80%.

8. The semiconductor light emitter of claim 6 wherein said varying concentration of magnesium cations of said second band gap control material of said graded injection region varies from a minimum of 0% to 10% to a maximum of 50% to 100%.

9. The semiconductor light emitter of claim 8 wherein said varying concentration of magnesium cations of said second band gap control material of said graded injection region varies from a minimum of about 10% to a maximum of about 60%.

10. The semiconductor light emitter of claim 8 wherein said varying concentration of magnesium cations of said second band gap control material of said graded injection region varies from a minimum of about 10% to a maximum of about 80%.

11. The semiconductor light emitter of claim 5 wherein said first and second band gap control materials are selected from the group consisting of metals from columns IIa and IIb of the periodic table.

12. The semiconductor light emitter of claim 3 wherein said binary compounds are selected from the group consisting of p-ZnTe, n-CdSe, p-BeTe, CdTe and ZnSe.

13. The semiconductor light emitter of claim 2 wherein said first and second semiconductor materials are ternary compounds.

14. The semiconductor light emitter of claim 13 wherein said first semiconductor material comprises BeZnTe, said second semiconductor material comprises ZnCdSe and said substrate comprises p-InP.

15. The semiconductor light emitter of claim 6 wherein said recombination region comprises the ternary alloy $Mg_yZn_{1-y}Te$ and said graded injection region comprises the ternary alloy n-$Mg_xCd_{1-x}Se$, wherein the recombination region has a fixed concentration of magnesium and said graded injection region has a varying concentration of magnesium across said injection region.

16. In a type-II heterojunction semiconductor light emitter formed on a substrate of a first electrical type and having a first semiconductor material of said first electrical type and a second semiconductor material of a second electrical type disposed so as to form a type-II heterojunction having a barrier, the improvement comprising:
a graded injection layer for accelerating charge carriers to overcome said barrier, said graded injection layer disposed between said first and second semiconductor materials comprising a band gap control material of varying concentration wherein said concentration is lowest where said graded injection region is closest to said second semiconductor material, wherein upon application of a sufficiently large forward bias, charge carriers from an electronic energy band of said second semiconductor material are compelled to the energy level of a like electronic energy band of said first semiconductor material.

17. The improvement of claim 16 wherein said first and second electrical types comprise p-type and n-type, respectively, said charge carriers comprise electrons, and said electronic energy bands of said first and second semiconductor materials comprise the conduction bands of said first and second semiconductor materials, respectively.

18. The improvement of claim 17 wherein said band gap control material of said graded injection layer comprises a metal which forms an alloy with said second semiconductor material.

19. The improvement of claim 18 wherein said band gap control material comprises magnesium.

20. The improvement of claim 17 wherein said second semiconductor material comprises n-CdSe and said band gap control material comprises magnesium, whereby said graded injection layer comprises the ternary alloy $Mg_xCd_{1-x}Se$ wherein the magnesium concentration varies from a maximum toward said first semiconductor material and to a minimum toward said second semiconductor material.

21. The improvement of claim 16 wherein said first and second electrical types comprise n-type and p-type, respectively, said charge carriers comprise holes, and said electronic energy bands of said first and second semiconductor materials comprise the valence bands of said first and second semiconductor materials, respectively.

22. The improvement of claim 16 wherein said semiconductor light emitter further comprises an active layer and an electron confinement layer such that said semiconductor light emitter operates as a semiconductor laser, said active layer being disposed between said graded injection layer and said first semiconductor material.

23. In a type-II heterojunction semiconductor light emitter formed on a substrate of a first electrical type and having a first semiconductor material of said first electrical type and a second semiconductor material of a second electrical type disposed so as to form a type-II heterojunction having a barrier, the improvement comprising:
a graded injection layer for accelerating charge carriers to overcome said barrier, said graded injection layer disposed between said first and second semiconductor materials comprising a band gap control material of varying concentration wherein said concentration is lowest where said graded injection layer is adjacent to said first semiconductor material, wherein upon application of a sufficiently large forward bias, charge carriers from an electronic energy band of said first semiconductor material are compelled to the energy level of a like electronic energy band of said second semiconductor material.

24. The improvement of claim 23 wherein said first and second electrical types comprise n-type and p-type, respectively, said charge carriers comprise electrons, and said electronic energy bands of said first and second semiconductor materials comprise the conduction bands of said first and second semiconductor materials, respectively.

25. The improvement of claim 16 wherein said first and second electrical types comprise p-type and n-type, respectively, said charge carriers comprise holes, and said electronic energy bands of said first and second semiconductor materials comprise the valence bands of said first and second semiconductor materials, respectively.

26. A blue/green semiconductor light emitting device comprising:
a substrate composed of a p-type semiconductor material;
a buffer layer composed of a p-type semiconductor material disposed on said substrate;
an electron reflector region composed of a high concentration of a metal in an alloy with a p-type material disposed on said buffer layer,
an electron-hole recombination layer composed of a metal in an alloy with a p-type semiconductor material wherein the band gap of said recombination layer varies from corresponding to the green to the blue as the concentration of the metal in the alloy is increased, said recombination layer being disposed over said electron reflector layer;
a graded injector layer composed of a metal in an alloy with an n-type semiconductor material, said n-type semiconductor material forming a type-II heterojunction with said p-type material, said type-II heterojunction having a barrier, said graded injector layer for accelerating charge carriers over said barrier;
an n-type source layer over which the graded injector region is formed; and first and second electrodes disposed on said n-type layer and said substrate respectively for receiving biasing currents.

27. The blue/green light emitter of claim 26 wherein said p-type and n-type materials comprise compounds of column II and column VI elements from the periodic table and said metal comprises a metal from column IIa or IIb.

28. The blue/green light emitter of claim 27 wherein the p-type material comprises ZnTe, the n-type material comprises CdSe, the metal comprises magnesium, the recombination layer alloy comprises $Mg_yZn_{1-y}Te$ and the graded injector alloy comprises $Mg_xCd_{1-x}Se:Al$.

* * * * *